US009897639B2

(12) United States Patent
Zhou

(10) Patent No.: US 9,897,639 B2
(45) Date of Patent: Feb. 20, 2018

(54) METHOD FOR IMPLEMENTING ELECTROMAGNETIC ANTI-INTERFERENCE FILTER IMPEDANCE MATCH AND MEASURING SYSTEM THEREOF

(75) Inventor: Ming Zhou, Guangdong Province (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 923 days.

(21) Appl. No.: 13/258,049

(22) PCT Filed: Jun. 25, 2010

(86) PCT No.: PCT/CN2010/074491
§ 371 (c)(1),
(2), (4) Date: Dec. 22, 2011

(87) PCT Pub. No.: WO2010/149077
PCT Pub. Date: Dec. 29, 2010

(65) Prior Publication Data
US 2012/0109558 A1    May 3, 2012

(30) Foreign Application Priority Data
Jun. 25, 2009 (CN) .......................... 2009 1 0148670

(51) Int. Cl.
*G01R 27/02* (2006.01)
*H03H 11/28* (2006.01)
(Continued)

(52) U.S. Cl.
CPC ........... *G01R 31/002* (2013.01); *G01R 27/02* (2013.01); *H01J 37/32183* (2013.01); *H03H 11/28* (2013.01); *H03H 11/30* (2013.01)

(58) Field of Classification Search
CPC ....................................... H03H 7/40
(Continued)

(56) References Cited

U.S. PATENT DOCUMENTS 4,196,475 A * 4/1980 Hall ................................. 702/65
5,337,261 A * 8/1994 Rogers ................. G01R 31/001
324/613
(Continued)

FOREIGN PATENT DOCUMENTS

CN    1389853 A    1/2003
CN    1516927 A    7/2004
(Continued)

OTHER PUBLICATIONS

International Search Report for PCT/CN2010/074491 dated Aug. 9, 2010.
(Continued)

*Primary Examiner* — Gregory J Toatley
*Assistant Examiner* — Michael Dalbo
(74) *Attorney, Agent, or Firm* — Ling Wu; Stephen Yang; Ling and Yang Intellectual Property

(57) ABSTRACT

A measuring system for implementing impedance matching of an electromagnetic immunity filter comprises an impedance measuring chip, an impedance reading device, and a power supply module and a load circuit in a circuit to be applied by the electromagnetic immunity filter; wherein, the impedance measuring chip, connected between the power supply module and the load circuit, is configured to output an excitation voltage to the load circuit, receive a current returned by the load circuit, calculate an impedance of the load circuit based on the excitation voltage and the current returned by the load circuit, and output the impedance to the impedance reading device; and the impedance reading device is configured to read the impedance calculated by the impedance measuring chip. Accordingly, the present invention further provides a method for implementing impedance matching of an electromagnetic immunity filter.

10 Claims, 1 Drawing Sheet

(51) Int. Cl.
*H03H 11/30* (2006.01)
*H01J 37/32* (2006.01)
*G01R 31/00* (2006.01)

(58) Field of Classification Search
USPC .......................................................... 702/65
See application file for complete search history.

(56) References Cited

U.S. PATENT DOCUMENTS

| | | | | |
|---|---|---|---|---|
| 6,081,123 | A * | 6/2000 | Kasbarian | H02J 13/0048 324/521 |
| 7,184,901 | B1 * | 2/2007 | Chiang | 702/57 |
| 2003/0184319 | A1 * | 10/2003 | Nishimori | H03H 11/30 324/684 |
| 2006/0036382 | A1 * | 2/2006 | Paz et al. | 702/76 |
| 2006/0055517 | A1 * | 3/2006 | Ghabra | B60R 25/2063 340/426.11 |
| 2008/0024951 | A1 * | 1/2008 | Mortensen | H02M 1/44 361/118 |
| 2008/0136422 | A1 * | 6/2008 | Clarridge | G01R 31/026 324/601 |
| 2008/0191712 | A1 * | 8/2008 | Eisenstadt et al. | 324/638 |
| 2009/0167457 | A1 * | 7/2009 | Melde | H01P 5/04 333/32 |
| 2010/0148795 | A1 * | 6/2010 | Ostrom et al. | 324/537 |

FOREIGN PATENT DOCUMENTS

| | | |
|---|---|---|
| CN | 1797012 A | 7/2006 |
| CN | 101036302 A | 9/2007 |
| CN | 101436850 A | 5/2009 |
| CN | 101655522 A | 2/2010 |
| CN | 101666768 A | 3/2010 |
| GB | 2249893 A | 5/1992 |

OTHER PUBLICATIONS

Analog Devices, 1MSPS, 12-Bit Impedance Converter, Network Analyzer, (Jun. 27, 2005) AD5933, www.analog.com. XP055415941.

Sheng Ye et al., A Novel EMI Filter Design Method for Switching Power Supplies, IEEE Transactions on Power Electronics, vol. 19, No. 6, Nov. 2004. XP055416208.

* cited by examiner

METHOD FOR IMPLEMENTING ELECTROMAGNETIC ANTI-INTERFERENCE FILTER IMPEDANCE MATCH AND MEASURING SYSTEM THEREOF

TECHNICAL FIELD

The present invention relates to the field of electronic circuit design, and in particular, to a method for implementing impedance matching of an electromagnetic interference filter and a measuring system thereof.

BACKGROUND TECHNIQUE

At present, the impedance problem that the whole circuit is used as a power supply load is required to be considered without exception in designs and tests in the filed of electronic circuits and electromagnetic compatibility. Taking authentication of electromagnetic compatibility as an example, when a product supplier obtains international authentication, both radiated emission and conducted emission are compulsory test items. It is well known that electromagnetic interference in a power supply part (a frequency band of 30 MHz-60 MHz) is a very important factor that influences test results, such as radiated emission and conducted emission. A common practice is to simulate the designed circuit, perform assessment tests constantly and then check omissions and make up deficiencies according to the test results, or replace devices, or modify printed circuit boards (PCB). Thus, the whole development period of the whole product is prolonged, costs are greatly increased and design effects are unsatisfactory. Although most of current power suppliers add a typical Electromagnetic Interference (EMI) filter in a power supply module, the effect is commonly not ideal. A main reason is that in the prior art, load impedance on which setting of parameters of the EMI filter is based is obtained through a simulation method and is a theoretical value. Thus, the impedance of the typical EMI filter is not matched with the load impedance such that frequency bands or frequency points filtered out by the filter are not at all frequency bands or frequency points that are expected to be filtered out.

SUMMARY OF THE INVENTION

A technical problem to be solved by the present invention is to provide a method for implementing impedance matching of an electromagnetic interference filter and a measuring system thereof so as to solve the problem that an impedance of a load circuit on which setting of parameters of an existing EMI filter is based is not accurate.

In order to solve the above technical problem, the present invention provides a measuring system for implementing impedance matching of an electromagnetic interference filter, which comprises an impedance measuring chip, an impedance reading device, and a power supply module and a load circuit in a circuit to be applied by the electromagnetic interference filter; wherein, the impedance measuring chip, connected between the power supply module and the load circuit, is configured to output an excitation voltage to the load circuit, receive a current returned by the load circuit, calculate an impedance of the load circuit based on the excitation voltage and the current returned by the load circuit, and output the impedance to the impedance reading device;

the impedance reading device is configured to read the impedance calculated by the impedance measuring chip.

The measuring system may be further characterized in that:

the impedance measuring chip comprises a direct digital synthesizer, an analog digital converter and a digital signal processor;

the direct digital synthesizer is configured to provide the excitation voltage to the load circuit;

the analog digital converter is configured to, after the load circuit returns the current, sample the current to transfer to the digital signal processor;

the digital signal processor is configured to perform discrete Fourier transform on the sampled current, calculate the impedance of the load circuit based on the excitation voltage and the discrete-Fourier-transformed current, the impedance including a real part and an imaginary part, and then calculate an amplitude and a phase of the impedance of the load circuit using the real part and imaginary part to send to the impedance reading device.

The measuring system may be further characterized in that:

a frequency of the excitation voltage provided by the direct digital synthesizer to the load circuit is a frequency corresponding to a noise peak of the power supply module.

The measuring system may be further characterized in that:

the impedance reading device is a frequency sweeper or a spectrum analyzer.

The measuring system may be further characterized in that:

the load circuit is a single board or a cabinet.

In order to solve the above problem, the present invention further provides a method for implementing impedance matching of an electromagnetic interference filter comprising the following steps of:

connecting a power supply module of a load circuit, an impedance measuring chip and the load circuit in sequence to constitute a measuring system, the impedance measuring chip providing an excitation voltage to the load circuit, and the load circuit returning an current to the impedance measuring chip;

the impedance measuring chip calculating an impedance of the load circuit based on the excitation voltage and the current returned by the load circuit and outputting the impedance to an impedance reading device, and the impedance reading device reading the impedance; and calculating a capacitance value and a common mode inductance value of the electromagnetic interference filter based on the impedance read by the impedance reading device, and setting the capacitance value and common mode inductance value of the electromagnetic interference filter.

The method may be further characterized in that:

the impedance measuring chip comprises a direct digital synthesizer, an analog digital converter and a digital signal processor, the step of the impedance measuring chip calculating the impedance of the load circuit based on the excitation voltage and the current returned by the load circuit and outputting the impedance to the impedance reading device comprises:

the direct digital synthesizer providing the excitation voltage to the load circuit; and after the load circuit returns the current, the analog digital converter sampling the current to transfer to the digital signal processor, the digital signal processor performing discrete Fourier transform on the sampled current, calculating the impedance of the load circuit based on the excitation voltage and the discrete-Fourier-transformed current, the impedance including a real part and an imaginary part, and then calculating an amplitude and a phase of the impedance of the load circuit using the real part and imaginary part to send to the impedance reading device.

The method may be further characterized in that: a frequency of the excitation voltage provided by the direct digital synthesizer to the load circuit is a frequency corresponding to a noise peak of the power supply module.

The method may be further characterized in that: the impedance reading device is a frequency sweeper or a spectrum analyzer.

The method may be further characterized in that: the load circuit is a single board or a cabinet.

The system described above solves the problem in the existing electronic circuit design technology that the impedance of a load circuit on which setting of parameters of an EMI filter is based is not accurate, a test process is greatly simplified, and pertinence of test results is strong. An impedances of a single board may be measured directly so as to provide the impedance of a network element system composed of different single boards and thin impedance granularity of the whole system to a single board level. In an embodiment, due to use of an impedance measuring chip, a big progress is made in rapid measurement of circuit impedance, and matching effect between the impedance of the designed EMI filter and the impedance of an actual circuit is achieved, thereby shortening the development period and saving costs, thinning the granularity of impedance measurement of the system, and facilitating subsequent circuit design work.

PREFERRED EMBODIMENTS OF THE INVENTION

A method for implementing impedance matching of an electromagnetic interference filter and a measuring system thereof in accordance with the present invention allow the impedance of an actual load circuit to be measured by the impedance measuring chip, and the impedance of the actual load circuit to be provided to an EMI filter for parameter setting such that the impedance of the EMI filter matches with the impedance of the actual load circuit.

The technical scheme of the present invention will be further described below in detail in conjunction with the accompanying drawings.

The measuring system for implementing impedance matching of the electromagnetic interference filter in this embodiment comprises an impedance measuring chip and an impedance reading device.

The impedance measuring chip (IMC), which is a universal device merging integration, fineness and practicability, can measure the complex impedance from 100Ω to 100 MΩ with an accuracy of 0.5%. Of course, with the development of the chip technology, the accuracy may be higher, and a range of the measured impedance may be wider. The impedance measuring chip comprises a direct digital synthesizer (DDS), an analog digital converter (ADC) and a digital signal processor (DSP).

The impedance reading device is configured to display the complex impedance of the load circuit calculated by the impedance measuring chip, and it may be a frequency sweeter, or may be other devices, such as a spectrum analyzer, that can read the impedance.

Figure 1:
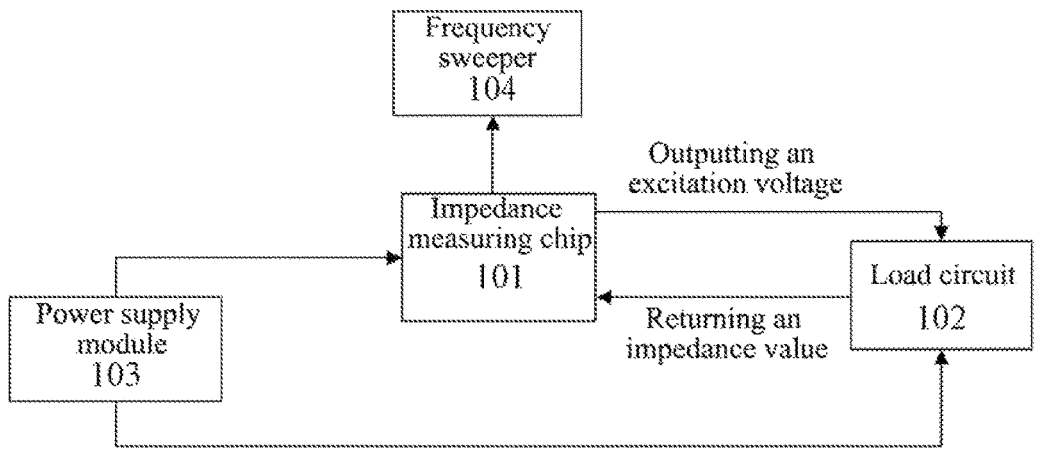
FIG. 1 is a block diagram of a measuring system according to an embodiment of the present invention.

FIG. 1 is a block diagram of a measuring system using the above measuring device of the present embodiment. In this figure, an IMC 101 is located at an output end of a power supply module 103 of a load circuit 102 and provides an excitation voltage to the load circuit 102 such that the whole load circuit 102 is used as a load of the IMC 101. Meanwhile, the IMC 101 receives an impedance returned by the load circuit 102 and then outputs the impedance of the load circuit 102 to an impedance reading device. A frequency sweeter 104 is taken as an example in this embodiment; wherein, the load circuit 102 is a single board or a cabinet.

The impedance returned by the load circuit is logically refers to the impedance returned by the load circuit. Physically, it is a current value that is returned by the load circuit. The IMC calculates the impedance of the load circuit based on the excitation voltage provided by the IMC and the current value returned by the load circuit.

A specific process of measurement will be described below.

A direct digital synthesizer of the IMC provides the excitation voltage to a device under test (DUT) (herein a load circuit) at a frequency point (which may be calculated in advance) of a noise peak of a power supply module. After the load circuit returns a current value to the IMC, an ADC samples the current value returned by the load circuit to transfer to the DSP. The DSP performs discrete Fourier transform (DFT) on the received signal and calculates the impedance of the load circuit using the excitation voltage, where the impedance of the load circuit includes a real part (R) and an imaginary part (I) data words. The DSP may calculate an amplitude and a phase of the impedance of the load circuit using the real part (R) and an imaginary part data words. The IMC sends the calculated amplitude and phase of the impedance to a frequency sweeter, which reads the impedance.

In the design of an EMI filter, a capacitance value and common mode inductance value of the EMI filter is required to be set. Therefore, when parameters are set for an EMI filer to be designed, a capacitance value and common mode inductance value of the EMI filter to be designed are only required to be calculated based on the impedance read by the frequency sweeter. Then parameters are set for the EMI filter using the calculated capacitance value and common mode inductance value to obtain the impedance of the EMI filter that matches with the impedance of the load circuit. Calculation of the capacitance value and common mode inductance value of an EMI filter to be designed using the impedance belongs to the prior art, and thus will not be described herein in detail.

Figure 2:
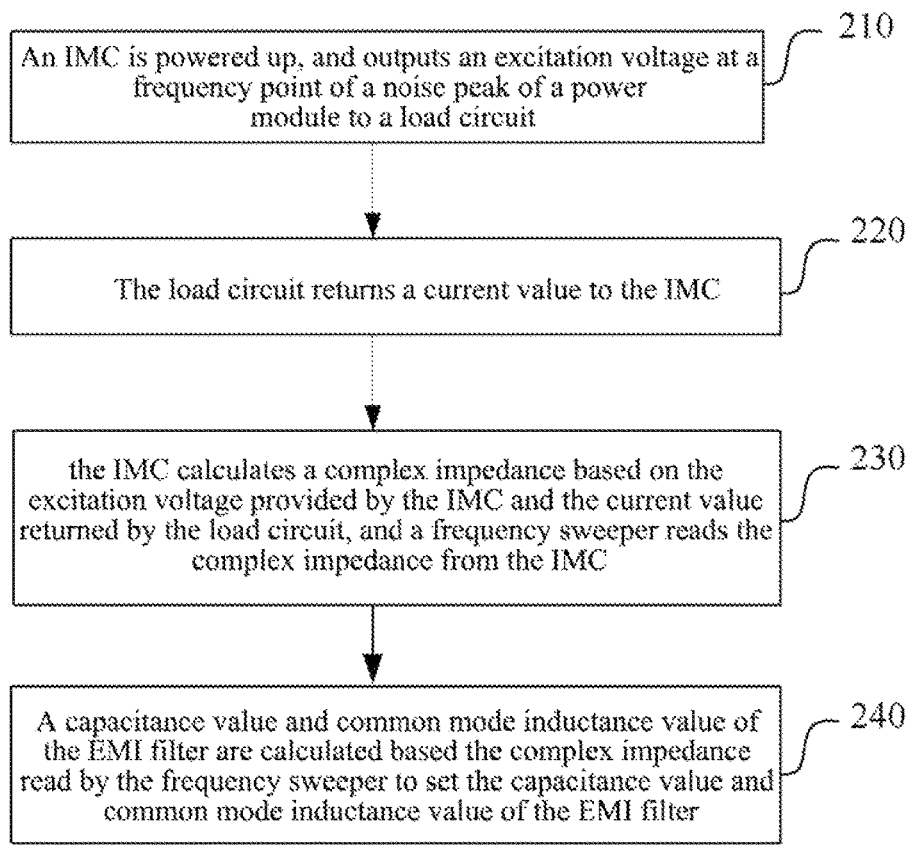
FIG. 2 is a flowchart of a measuring method according to an embodiment of the present invention.

FIG. 2 is a flowchart of a measuring method using the measuring system described above, which comprises the following steps.

Step 210, an IMC is powered up, and outputs an excitation voltage at a frequency point of a noise peak of a power supply module to a load circuit.

Step 220, the load circuit returns a current value to the IMC.

Step 230, the IMC calculates a complex impedance based on the excitation voltage provided by the IMC and the current value returned by the load circuit, and a frequency sweeter reads the complex impedance from the IMC.

Step 240, a capacitance value and common mode inductance value of the EMI filter are calculated based on the complex impedance read by the frequency sweeter so as to set the capacitance value and common mode inductance value of the EMI filter.

The above description is the preferred embodiment of the present invention only, but the protection scope of the present invention is not limited thereto. Any variation or substitution that may occur to those skilled in the art within the technical scope disclosed in the present invention should be covered in the protection scope of the present invention. Therefore, the protection scope of the present invention should be subject to the protection scope of the appended claims.

INDUSTRIAL APPLICABILITY

The method for implementing impedance matching of an electromagnetic interference filter and a measuring system thereof in accordance with the present invention solves the problem in the existing electronic circuit design technology that the impedance of a load circuit on which setting of parameters of an EMI filter is based is not accurate, a test process is greatly simplified, and pertinence of test results is strong. An impedance of a single board may be measured directly so as to provide the impedance of a network element system composed of different single boards and thin impedance granularity of the whole system to a single board level.

What is claimed is:

1. A measuring system for implementing impedance matching of an Electromagnetic Interference (EMI) filter, comprising: an impedance measuring chip and an impedance reading device; wherein,
   the impedance measuring chip is located at an output end of a power supply module of a load circuit, and the impedance measuring chip is configured to provide an excitation voltage at a frequency point of a noise peak of the power supply module to the load circuit so as to take the whole load circuit as a load of the impedance measuring chip, receive a current returned by the load circuit, calculate an impedance of the load circuit based on the excitation voltage at the frequency point of the noise peak of the power supply module and the current returned by the load circuit, and output the impedance of the load circuit to the impedance reading device; and
   the impedance reading device is configured to read and display the impedance of the load circuit calculated by the impedance measuring chip;
   wherein a circuit for calculating the impedance of the load circuit comprises the measuring system, the power supply module and the load circuit, the EMI filter is not included by the measuring system, and the EMI filter is not included in the circuit comprising the measuring system, the power supply module and the load circuit when the measuring system is used to calculate the impedance of the load circuit, only the impedance of the load circuit calculated by the impedance measuring chip and read by the impedance reading device is used to calculate a capacitance value and a common mode inductance value set for the EMI filter, parameters are set for the EMI filter using the calculated capacitance value and common mode inductance value to obtain an impedance of the EMI filter that matches with the impedance of the load circuit before the EMI filter is applied to a circuit which comprises the power supply module and the load circuit.

2. The measuring system according to claim 1, wherein the impedance measuring chip comprises a direct digital synthesizer, an analog digital converter and a digital signal processor;
   the direct digital synthesizer is configured to provide the excitation voltage to the load circuit;
   the analog digital converter is configured to, after the load circuit returns the current, sample the current to transfer to the digital signal processor; and
   the digital signal processor is configured to perform discrete Fourier transform on the sampled current, calculate the impedance of the load circuit based on the excitation voltage and the discrete-Fourier-transformed current, the impedance including a real part and an imaginary part, and then calculate an amplitude and a phase of the impedance of the load circuit using the real part and imaginary part to send to the impedance reading device.

3. The measuring system according to claim 2, wherein a frequency of the excitation voltage provided by the direct digital synthesizer to the load circuit is a frequency corresponding to a noise peak of the power supply module.

4. The measuring system according to claim 1, wherein the impedance reading device is a frequency sweeper or a spectrum analyzer.

5. The measuring system according to claim 1, wherein the load circuit is a single board or a cabinet.

6. A method for implementing impedance matching of an Electromagnetic Interference (EMI) filter, comprising the following steps of:
   an impedance measuring chip being connected with an impedance reading device to constitute a measuring system, locating the impedance measuring chip at an output end of a power supply module of a load circuit, the impedance measuring chip providing an excitation voltage at a frequency point of a noise peak of the power supply module to the load circuit so as to take the whole load circuit as a load of the impedance measuring chip, and the load circuit returning an current to the impedance measuring chip; and
   the impedance measuring chip calculating an impedance of the load circuit based on the excitation voltage at the frequency point of the noise peak of the power supply module and the current returned by the load circuit and outputting the impedance of the load circuit to an impedance reading device, and the impedance reading device reading and display the impedance of the load circuit;
   wherein a circuit for calculating the impedance of the load circuit comprises the measuring system, the power supply module and the load circuit, the EMI filter is not included by the measuring system, and the EMI filter is not included in the circuit comprising the measuring system, the power supply module and the load circuit when the measuring system is used to calculate the impedance of the load circuit, only the impedance of the load circuit calculated by the impedance measuring chip and read by the impedance reading device is used to calculate a capacitance value and a common mode inductance value set for the EMI filter, parameters are set for the EMI filter using the calculated capacitance value and common mode inductance value to obtain an impedance of the EMI filter that matches with the impedance of the load circuit before the EMI filter is applied to a circuit which comprises the power supply module and the load circuit.

7. The method according to claim 6, wherein the impedance measuring chip comprises a direct digital synthesizer, an analog digital converter and a digital signal processor, the step of the impedance measuring chip calculating the impedance of the load circuit based on the excitation voltage and the current returned by the load circuit and outputting the impedance to the impedance reading device comprises:

the direct digital synthesizer providing the excitation voltage to the load circuit; and after the load circuit returns the current, the analog digital converter sampling the current to transfer to the digital signal processor, the digital signal processor performing discrete Fourier transform on the sampled current, calculating the impedance of the load circuit based on the excitation voltage and the discrete-Fourier-transformed current, the impedance including a real part and an imaginary part, and then calculating an amplitude and a phase of the impedance of the load circuit using the real part and imaginary part to send to the impedance reading device.

8. The method according to claim 7, wherein a frequency of the excitation voltage provided by the direct digital synthesizer to the load circuit is a frequency corresponding to a noise peak of the power supply module.

9. The method according to claim 6, wherein the impedance reading device is a frequency sweeper or a spectrum analyzer.

10. The method according to claim 6, wherein the load circuit is a single board or a cabinet.

* * * * *